(12) United States Patent
Schaub et al.

(10) Patent No.: US 11,383,662 B2
(45) Date of Patent: Jul. 12, 2022

(54) OCCUPANT CLASSIFICATION SYSTEM WITH PRESSURE OR WEIGHT AND CAPACITANCE SENSING

(71) Applicant: GM GLOBAL TECHNOLOGY OPERATIONS LLC, Detroit, MI (US)

(72) Inventors: Carl N. Schaub, Rochester, MI (US); Scott D. Thomas, Novi, MI (US); Orhan Demirovic, Sterling Heights, MI (US); Chad M. O'Brien, Shelby Township, MI (US); Patricia A. Mccown, Farmington Hills, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 221 days.

(21) Appl. No.: 16/600,113

(22) Filed: Oct. 11, 2019

(65) Prior Publication Data
US 2021/0107420 A1    Apr. 15, 2021

(51) Int. Cl.
| | | |
|---|---|---|
| *B60R 21/01* | (2006.01) | |
| *B60R 21/015* | (2006.01) | |
| *B60N 2/00* | (2006.01) | |
| *G01G 19/50* | (2006.01) | |
| *G01G 5/00* | (2006.01) | |
| *G01R 27/26* | (2006.01) | |
| *G05D 1/02* | (2020.01) | |

(52) U.S. Cl.
CPC ........ *B60R 21/01524* (2014.10); *B60N 2/002* (2013.01); *B60R 21/015* (2013.01); *G01G 5/006* (2013.01); *G01G 19/50* (2013.01); *G01R 27/2605* (2013.01); *B60R 2021/01211* (2013.01); *B60R 2021/01265* (2013.01); *G05D 1/021* (2013.01)

(58) Field of Classification Search
CPC ............ B60R 21/01524; B60R 21/015; B60R 2021/01211; B60R 2021/01265; B60N 2/002; G01G 5/006; G01G 19/50; G01R 27/2605; G05D 1/021
See application file for complete search history.

(56) References Cited

U.S. PATENT DOCUMENTS

| | | | |
|---|---|---|---|
| 6,784,379 B2 * | 8/2004 | Breed | B60N 2/002 177/144 |
| 7,401,532 B2 | 7/2008 | Wanami | |
| 2006/0219460 A1 * | 10/2006 | Wanami | B60R 21/01532 180/273 |
| 2010/0052380 A1 * | 3/2010 | Lee | B60N 2/002 297/217.2 |
| 2010/0152975 A1 * | 6/2010 | Nakagawa | B60R 21/01532 701/45 |

(Continued)

Primary Examiner — Tyler J Lee
Assistant Examiner — Yufeng Zhang (57) ABSTRACT

An occupant classification system comprises a capacitive sensor configured to measure capacitance. The capacitive sensor is at least partially arranged between a seat frame and at least one of a seat cover and a seat cushion of a seat. A sensor is configured to measure at least one of weight and pressure on the seat. The sensor is at least partially arranged between a vehicle structure and a component of the seat. A controller is configured to generate an occupant classification based on the measured capacitance and the at least one of the measured weight and the measured pressure on the seat.

19 Claims, 3 Drawing Sheets

(56) References Cited

U.S. PATENT DOCUMENTS

| 2013/0073148 A1* | 3/2013 | Dolan | B60R 21/013 |
| | | | 701/45 |
| 2015/0091280 A1* | 4/2015 | Nagasawa | B60R 21/01516 |
| | | | 280/730.1 |

* cited by examiner

OCCUPANT CLASSIFICATION SYSTEM WITH PRESSURE OR WEIGHT AND CAPACITANCE SENSING

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure relates to systems and methods for classifying occupants of a seat in a vehicle.

Some vehicle systems may need to determine the presence or absence of an occupant in a particular seat of a vehicle. For example, a passenger seat may include a sensor to detect the presence or absence of a passenger in the passenger seat. If the passenger is detected, one or more airbags can be enabled so that it can deploy if needed. A visual or audible seatbelt alert may also be generated when an occupant is detected in the seat but is not wearing a seat belt. Sometimes objects such as water bottles, groceries, electronic devices, etc. may be detected as a passenger in the seat and the visual or audible seat belt alert is generated incorrectly. Likewise, some children in child restraint seats may or may not be detected.

SUMMARY

An occupant classification system comprises a capacitive sensor configured to measure capacitance. The capacitive sensor is at least partially arranged between a seat frame and at least one of a seat cover and a seat cushion of a seat. A sensor is configured to measure at least one of weight and pressure on the seat. The sensor is at least partially arranged between a vehicle structure and a component of the seat. A controller is configured to generate an occupant classification based on the measured capacitance and the at least one of the measured weight and the measured pressure on the seat.

In other features, the controller is configured to detect absence of an occupant directly on a vehicle seating surface when the measured capacitance is less than a predetermined capacitance. The controller is configured to, in response to the detected absence of the occupant directly on the vehicle seating surface, compare the at least one of the measured pressure and the measured weight on the seat to at least one of a predetermined pressure and a predetermined weight, respectively, and generate the occupant classification differentiating between an empty condition/light object and a large object/child restraint seat located on the seat based on the comparison.

In other features, the controller is configured to detect presence of an occupant directly on a vehicle seating surface when the measured capacitance is greater than a predetermined capacitance. The controller is configured to, in response to the detected presence of the occupant directly on the vehicle seating surface, compare the at least one of the measured pressure and the measured weight on the seat to one or more predetermined pressure thresholds or one or more predetermined weight thresholds, respectively, and generate the occupant classification by differentiating between i) a capacitive object or small occupant, ii) a small occupant, and iii) a large occupant, larger than the small occupant, on the vehicle seating surface based on the comparison.

In other features, the controller is configured to, in response to the detected presence of the occupant directly on the vehicle seating surface, select a non-adult classification as the occupant classification if the at least one of the measured pressure and the measured weight is less than a first predetermined pressure threshold or a first predetermined weight threshold, respectively. The controller is configured to, in response to the detected presence of the occupant directly on the vehicle seating surface, select a non-adult classification as the occupant classification if the at least one of the measured pressure and the measured weight is greater than the first predetermined pressure threshold and less than a second predetermined pressure threshold or greater than the first predetermined weight threshold and less than a second predetermined weight threshold, respectively.

In other features, the controller is configured to, in response to the detected presence of the occupant directly on the vehicle seating surface, select an adult classification as the occupant classification if the at least one of the measured pressure and the measured weight is greater than the first predetermined pressure threshold and the second predetermined pressure threshold or greater than the first predetermined weight threshold and the second predetermined weight threshold, respectively.

In other features, the controller is further configured to alter at least one operating parameter of a vehicle system in response to the occupant classification. The vehicle system includes an airbag system and the at least one operating parameter of the airbag system includes enabling or disabling airbag operation. The vehicle system includes a seat belt sensing system and the at least one operating parameter of the seat belt sensing system includes enabling or disabling seat belt sensing.

In other features, the controller is further configured to communicate with a seat belt sensing system and to assess restraint usage when the measured capacitance is less than the predetermined capacitance and the at least one of the measured weight and the measured pressure is greater than a first predetermined weight or a first predetermined pressure. The controller is further configured to disable an airbag system when the measured capacitance is less than the predetermined capacitance.

In other features, the controller is further configured to communicate with a seat belt sensing system and to not assess restraint usage when the measured capacitance is less than the predetermined capacitance and the at least one of the measured pressure and the measured weight is less than a predetermined pressure threshold or a predetermined pressure threshold, respectively.

In other features, the controller is further configured to enable an airbag system in response to the adult classification. The controller is configured to communicate with a seat belt sensing system and to assess restraint usage in response to the adult classification.

In other features, the controller is further configured to at least one of enable or disable an airbag system and communicate with a seat belt sensing system to assess restraint usage in response to the non-adult classification.

In other features, the capacitance sensor includes a conductive material and a capacitance measuring circuit connected to the conductive material and configured to generate the measured capacitance. The sensor includes at least one of a bladder enclosing a fluid and a pressure sensor configured to sense a pressure of the fluid in the bladder, and a load cell.

In other features, the controller is configured to initiate occupant classification in response to at least one of an ignition changing state from OFF to ON, a vehicle door changing state; a drive state of the vehicle changing; a seat belt buckle status changing state; the occupant classification system detecting a change in the at least one of the measured capacitance, the measured weight and the measured pressure; and an autonomous ride state changing.

In other features, the controller is configured to terminate occupant classification in response to at least one of an ignition changing state from ON to OFF; a predetermined amount of time has passed after an occupant classification was performed; the vehicle is taken out of a drive state; a door is opened; and a stop ride signal is generated.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

While the foregoing description relates to vehicles, the occupant classification system according to the present disclosure can be used to detect the presence or absence of an occupant in a non-vehicle application or other objects in vehicle or non-vehicle applications based upon both capacitance and pressure or weight sensing.

The occupant classification system according to the present disclosure uses a combination of a capacitive sensor and a weight or pressure sensor to classify an occupant in a seat of a vehicle. Airbag systems, seatbelt restraint systems, autonomous control systems, and/or other vehicle control systems can use the classification information generated by the occupant classification system to alter one or more operating parameters thereof and/or to generate audible or visual alerts. The use of both capacitance and pressure or weight sensors as inputs allows the classification system to provide more information. For example, capacitance and pressure or weight can be used distinguish between objects (such as water bottles, groceries, electronic devices, etc.), a child in a child restraint seat and/or an occupant sitting on the seat. Generally, the child is offset from the vehicle seat surface when arranged in a child restraint seat.

Occupant classification based only on pressure or only on weight typically require secondary inputs to detect a child in a child restraint seat. The secondary inputs may include outputs from automatic locking retractors or seat belt tension sensors. However, this approach is dependent upon proper use by a customer and can result in false positives in some circumstances. In addition, some child restraint seats may use LATCH anchors if they are available in the vehicle seat and the vehicle seat belt may not be used.

Occupant classification systems and methods according to the present disclosure use a hybrid sensing approach that is based on both capacitance sensing and pressure or weight sensing, which improves the accuracy of the classification results. In some examples, the output of the capacitive sensor is used as a primary input and the output of the pressure or weight sensor is used as a secondary input. More particularly, the measured capacitance from the capacitance sensor is initially used to distinguish between a living being and an object such as a liquid container, electronic device, etc. The opposite approach can also be taken where the output of the pressure or weight sensor is the primary input and the output of the capacitive sensor is the secondary input. This hybrid sensing approach can have the pressure or weight sensing supplemented by outputs from automatic locking retractors or seat belt tension sensors.

Occupant classification systems that are based only on capacitance may generate false positives when charging devices or liquid containers are arranged on the seat. This is due to the fact that the output of the capacitance sensor is used as a primary differentiator. However, the occupant classification system described herein use both pressure or weight and capacitance to prevent incorrect enabling of an airbag system when charging devices or liquid containers are arranged on the seat.

Figures 1A, 2:
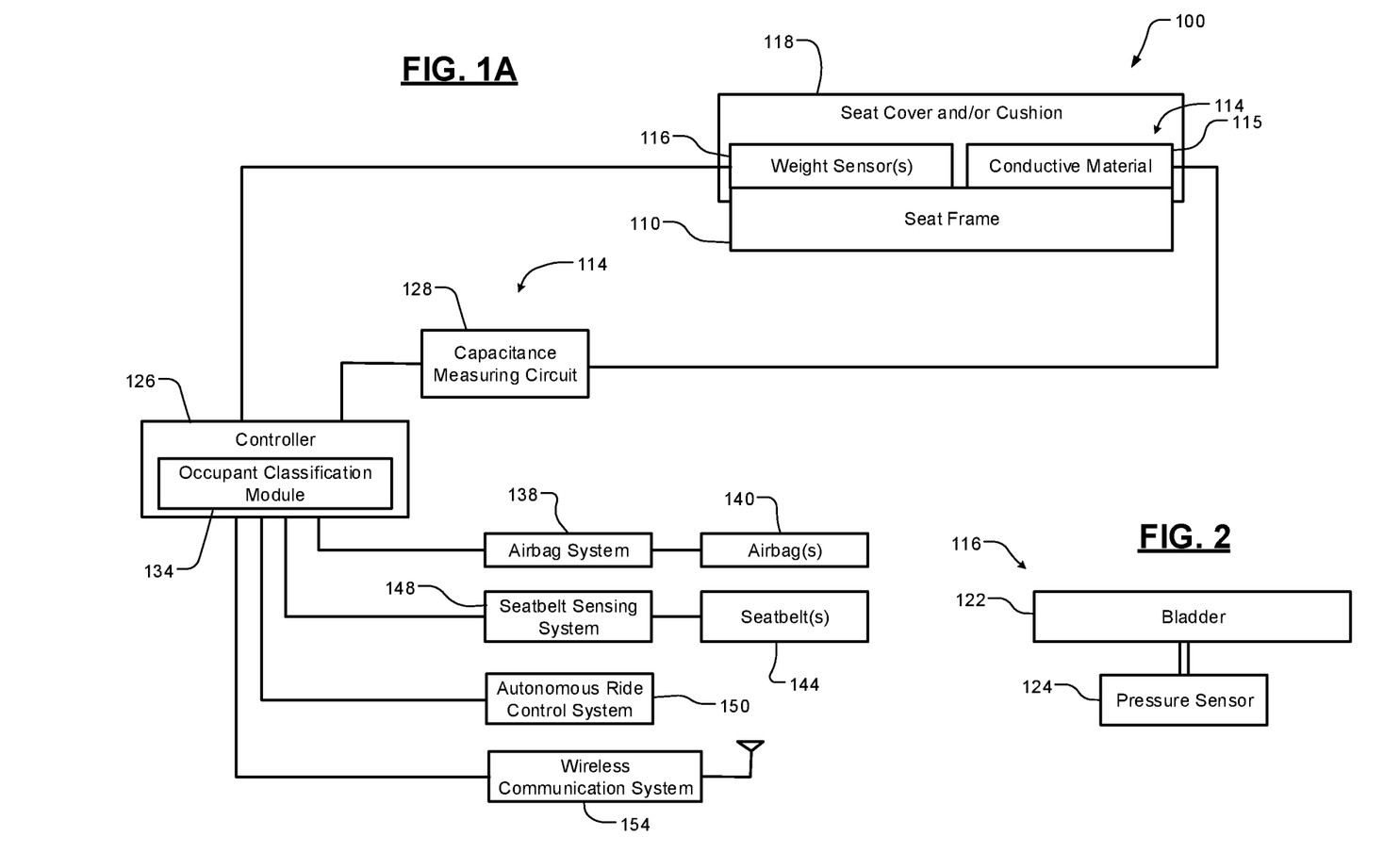
FIGS. 1A and 1B are functional block diagrams of examples of occupant classification systems for a vehicle according to the present disclosure.
FIG. 2 is a functional block diagram of an example of a pressure sensor according to the present disclosure.
Figure 1B:
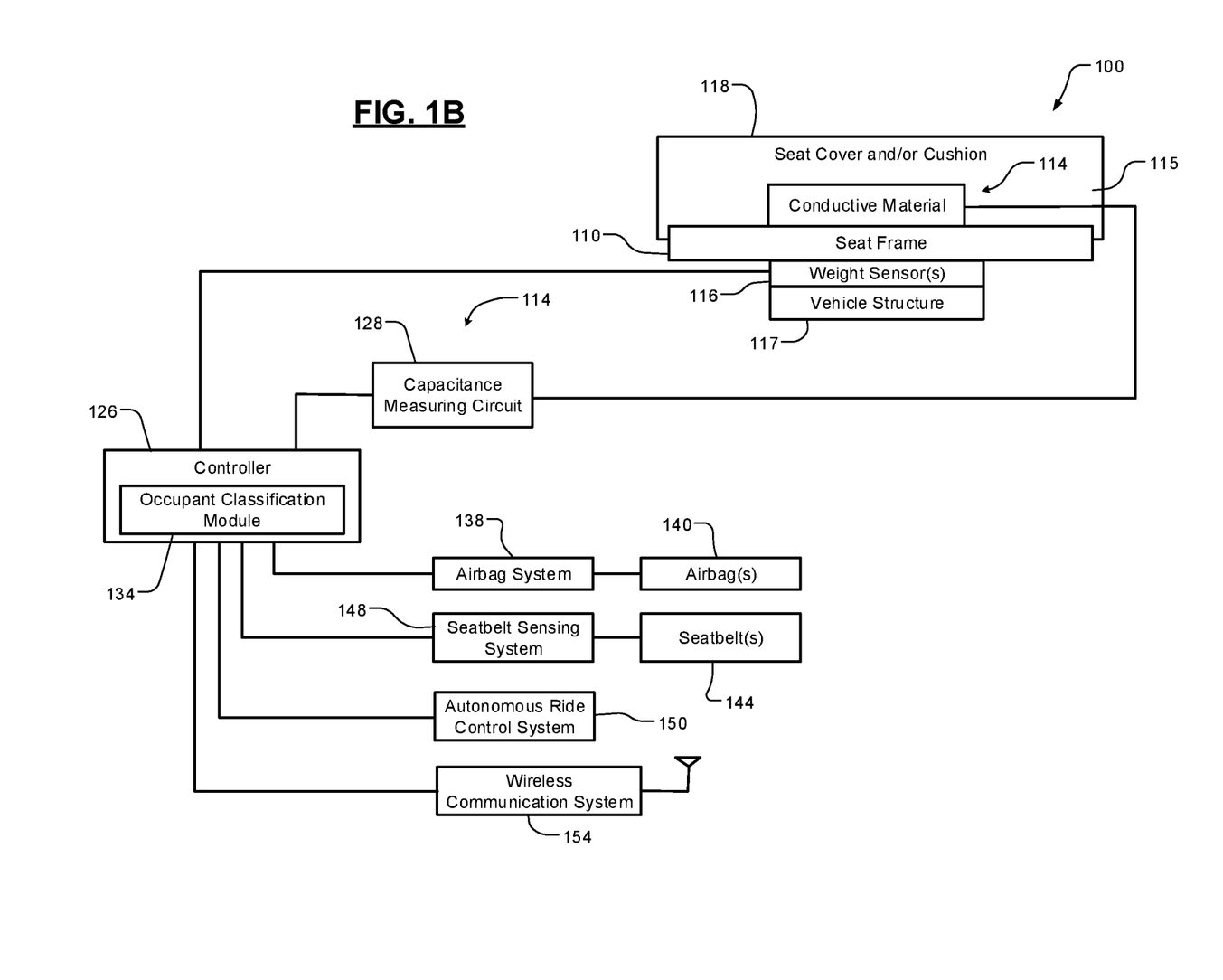

Referring now to FIGS. 1 and 2, an occupant classification system 100 is shown. In FIG. 1, one or more weight sensors 116 and one or more capacitance sensors 114 are arranged between a seat frame 110 and a seat cover and/or cushion 118. Alternatively, the weight sensors 116 can be arranged between the seat frame 110 and another seat structure or another vehicle structure 117.

In some examples, the capacitance sensor 114 may comprise a conductive material 115 and a capacitance measuring circuit 128. The conductive material 115 can include one or more conductive strips, conductive surfaces, conductor loops or non-overlapping conductor patterns. The conductive material 115 is arranged in a plane located parallel and below a plane including a seat surface. When an occupant sits on the seat surface, the occupant alters the capacitance of the conductive material 115, which is sensed by the capacitance measuring circuit 128. In some examples, the capacitance sensor 114 is located under a center rearward portion of a seating surface below a location where an occupant sits and below a child restraint seat. IN some examples, the child restraint seat is a rear-facing child restraint seat.

In some examples, the capacitance sensor is arranged in a location under where a child restraint seat is placed and away from the outer edges where the sensor does not detect capacitance to be above a predetermined threshold in response to an arm, leg or other body part of a child seated in a child restraint seat being dangled over the edge of the child restraint seat where it touches the vehicle seating surface.

Examples of the capacitance measuring circuit 128 include capacitive divider circuits, resonant circuits and/or other circuits that can be used to detect changes in capacitance due to the presence or absence of an occupant on the seat. Non-limiting examples of the capacitance sensors 114, conductive material 115 and/or capacitance measuring circuits 128 may be found in U.S. Pat. No. 7,401,532, issued on Jul. 22, 2008, which is hereby incorporated by reference in its entirety.

In some examples, the weight sensor 116 measures pressure changes in response to differences in seated weight of an occupant, device or other object located on the seat. For example, the weight sensor 116 may include one or more bladders 122 (FIG. 2) enclosing a fluid such as a liquid (e.g. silicone) or gas (e.g. air). The weight sensors 116 further include one or more pressure sensors 124 in fluid communication with the bladder 122. The pressure sensors 124 sense changes in the pressure of the fluid located in the bladder 122 (relative to an unoccupied seat). When the occupant sits on the seat, the bladder 122 is compressed and the pressure of the fluid in the bladder 122 increases based on the seated pressure of the occupant.

In some examples, the bladder 122 can be shaped to be more sensitive to loading in some seat regions as compared to than other regions. While the bladder 122 and the pressure sensor 124 are disclosed, other types of pressure sensors such as stress or strain-based pressure sensors can also be used. In addition pressure readings can be adjusted if an automatic locking retractor (ALR) usage is detected by an additional sensor or a high seat belt tension is detected by a belt tension sensor, as ALR usage and high seat belt tension is an indication that a child restraint seat is attached and properly tightened to the vehicle by the seat belt.

Occupant weight can be determined using a load cell that is arranged between two structures, such as between the seat frame 110 and another seat or vehicle structure 117. Any type of sensor that can measure load can be used, although most load cells use a strain gage approach. In addition weight readings can be adjusted if an automatic locking retractor (ALR) usage is detected by an additional sensor or a high seat belt tension is detected by a belt tension sensor, as ALR usage and high seat belt tension is an indication that a child restraint seat is attached and properly tightened to the vehicle by the seat belt The controller 126 includes an occupant classification module 134 that classifies an occupant based on the measured pressure or measured weight and capacitance. In some examples, the controller 126 provides the classification decision to other vehicle systems such as an airbag system 138 (controlling airbags 140 and generating a visual alert), a seatbelt restraint system 148 (monitoring seatbelts 144 and generating visual or audible alerts), a ride control system 150 (controlling start ride decisions for an autonomous vehicle and generating visual and audible alerts), an external communication system 154 that can contact a remote server or human at a home office (both not shown) of the autonomous vehicle if an issue is noticed and/or various other vehicle systems.

Figure 3:
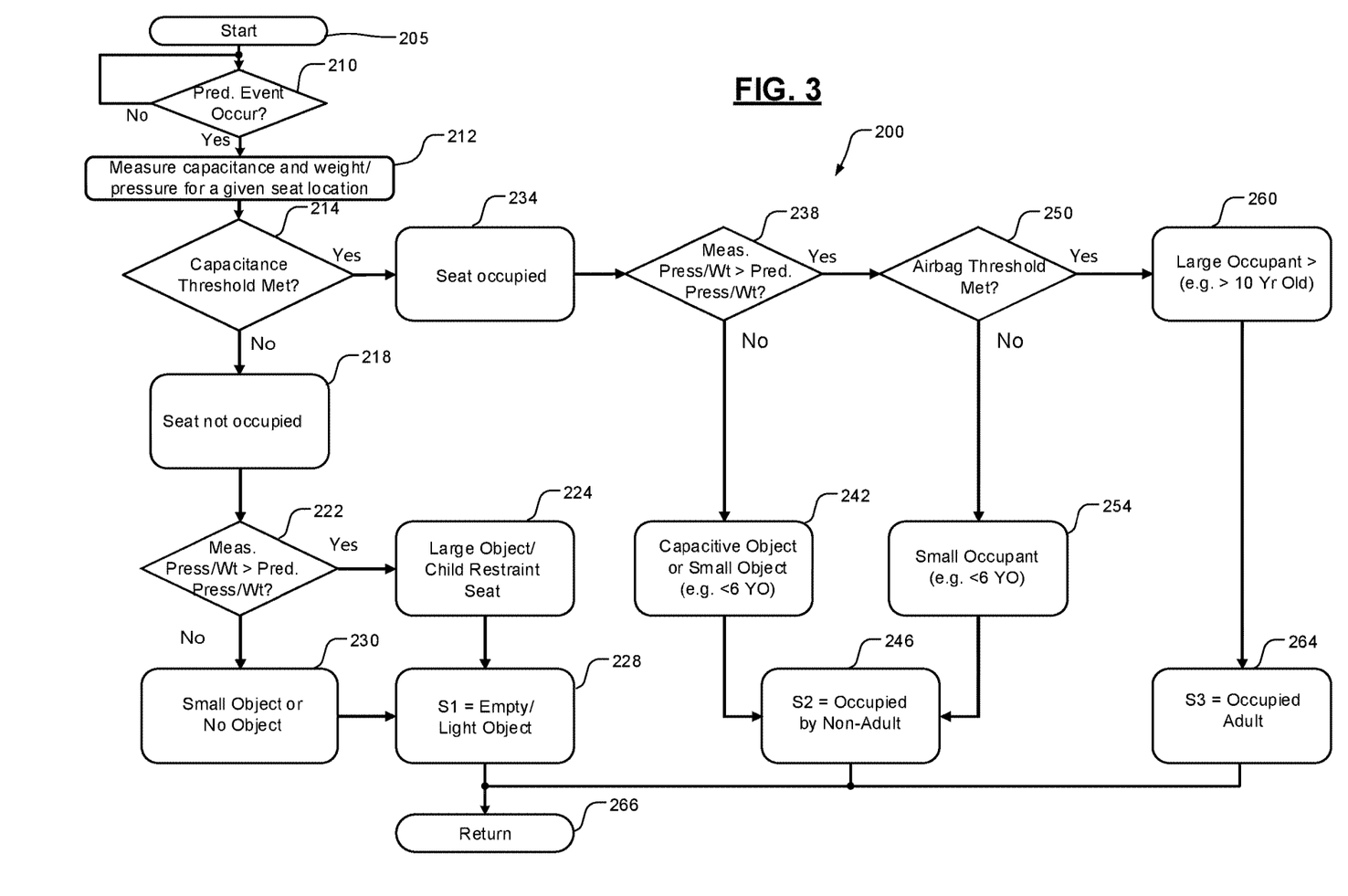
FIG. 3 is a flowchart of an example of a method for classifying an occupant of a vehicle according to the present disclosure.

Referring now to FIG. 3, a method 200 for classifying an occupant of a vehicle is shown. The method starts at 205 and proceeds to 210. At 210, the method determines whether a predetermined event occurs. For example, the predetermined event may correspond to the ignition changing state from OFF to ON, the doors being closed, the vehicle being placed into a drive state, the seat belt buckle status state changes from bucked to unbuckled, the seat belt status state changes from unbuckled to buckled, a portion of the occupant detection system detects a change in state, or a command given to start a ride. When 210 is true, the method measures the capacitance and the pressure or weight for one or more seats of the vehicle at 212.

At 214, the method determines whether the measured capacitance is greater than a predetermined capacitance threshold (corresponding to a typical capacitance value of an occupant seated on the seat). In some examples, an occupant is detected when the measured capacitance is greater than the predetermined capacitance threshold. In some examples, an occupant is not detected when the measured capacitance is less than the predetermined capacitance threshold. If 214 is false (the capacitance is less than the threshold) (and no occupant is detected), the seat is declared not occupied at 218.

At 222, the method determines whether a measured pressure or weight is greater than or equal to a predetermined pressure or weight threshold. In some examples, the pressure or weight is compared to a predetermined SBR threshold which is the amount of pressure or weight on the seat to activate the seat belt reminder (SBR). If the measured pressure or weight is greater than the SBR threshold, it is likely that a large object or child restraint seat (either with or without a child in it) is on the vehicle seat. If the measured pressure or weight is less than the predetermined pressure or weight threshold, it is not likely that a large object or child restraint seat (with or without a child in it) is on the vehicle seat.

If 222 is true (equal to or above the threshold), the method declares that a large object or child restraint seat (with or without a child in it) is on the seat at 224. At 224, the method can optionally assess if the child restraint seat or child in the child restraint seat is properly attached to the vehicle via a seat belt or LATCH anchor attachments. The method then proceeds to 228 to classify the configuration of the vehicle seat as state 1 (S1) or "empty/light object" and the method returns at 266. At either 224 or at 228, the method can optionally suppress at least one airbag associated with the vehicle seat being sensed.

At return 266, the method proceeds to 205 and continues monitoring and running, or stops running if one of the following conditions occurs: the vehicle is turned from ON to OFF, the vehicle is taken out of a drive state, a predetermined amount of time has passed after the classification has been made, a door is opened, or a stop ride signal is given. If the method stops running, the method can shut down all the occupant detection sensors or just one sensor type. If one sensor type is left in a detection mode, then the method can be started again if that sensor detects a change in state.

If 222 is false (below the threshold), the method declares that a small object or no object is on the seat at 230. The method continues from 230 to 228 where the method classifies the configuration of the vehicle seat as state 1 (S1) or "empty/light object" and the method returns at 266. At either 230 or 228, the method can optionally suppress at least one airbag.

If 214 is true (the capacitance threshold is met or exceeded), the method determines that the seat is occupied at 234 and proceeds to 238. At 238, the method determines whether a measured pressure or weight is greater than or equal to a predetermined pressure or weight threshold. In some examples, the pressure or weight is compared to a predetermined SBR threshold. Note that the threshold in 238 may be the same threshold as in 222 or a different threshold value. If the predetermined SBR threshold is not met (a value below the threshold is measured) as determined at 238, the method continues at 242 where the method declares that a capacitive object or small occupant (e.g. <6 year old) is in the vehicle seat. At 242, the method can optionally initiate a step to assess if the child is properly attached to the vehicle via a seat belt.

In some examples, the small occupant may be defined as equal to or less than a seated pressure or weight corresponding to a typical 6 year old or an occupant slightly greater in size/mass than this. The method continues at 246 where the method classifies the configuration of the vehicle seat as state 2 (S2) or "occupied by a non-adult" and the method returns at 266. At either 242 or at 246, the method can optionally suppress or enable at least one airbag.

If 238 is true (a value greater than or equal to the predetermined pressure or weight threshold), the method continues at 250. At 250, the method determines whether a measured pressure or weight is greater than or equal to a second predetermined pressure or weight threshold. In some examples, the measured pressure or weight is compared to a predetermined airbag pressure or weight threshold and determines whether a measured pressure or weight is greater than or equal to a predetermined airbag pressure or weight threshold. If 250 is false (the measured value is less than the predetermined threshold), the method continues at 254 and the method determines that the occupant is a small occupant. At 254, the method can optionally initiate a step to assess if the small occupant is properly attached to the vehicle via a seat belt.

The method continues from 254 to 246 where the method classifies the configuration of the vehicle seat as state 2 (S2) or "occupied by a non-adult" and the method returns at 266. At either 254 or 246, the method can suppress or enable at least one airbag.

If 250 is true (a value greater than or equal to the threshold is detected), the method continues at 260 wherein the method declares that a large occupant is on the seat. At 254, the method can optionally initiate a step to assess if the large occupant is properly attached to the vehicle via a seat belt. In some examples, the large occupant may be defined as a seated pressure or weight greater than a typical 10 year old. The method continues at 264 where the method classifies the configuration of the vehicle seat as state 3 (S3) or "occupied by an adult" and the method returns at 266. At either 260 or at 264, the method can optionally enable at least one airbag.

The method described in FIG. 3 evaluates a capacitance value before a pressure or weight value is evaluated. This method can be reversed where the pressure or weight value is evaluated (as shown in boxes 222/228 and 250) before the capacitance value is assessed (in box 214).

The occupant classification system according to the present disclosure improves classification decisions relating to occupants of vehicles. As a result, the improved classification information tends to reduce false visual or audible alerts that may otherwise occur when a child restraint seat, bottle, electronic device, etc. is placed on the seat. Furthermore, the improved classification information can be used to distinguish between a child restraint seat and an occupant and the airbag system and if present a restraint attachment detection system can be adjusted accordingly.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. An occupant classification system comprising:
   a capacitive sensor configured to measure capacitance, wherein the capacitive sensor is at least partially arranged between a seat frame and at least one of a seat cover and a seat cushion of a seat;
   a sensor configured to measure at least one of weight and pressure on the seat,
   wherein the sensor is at least partially arranged between a vehicle structure and a component of the seat; and
   a controller configured to
     generate an occupant classification based on the measured capacitance and the at least one of the measured weight and the measured pressure on the seat, wherein the occupant classification differentiates between (i) an empty seat or a non-occupant object weighing less than or equal to a first predetermined weight threshold and (ii) a child restraint seat or a non-occupant object weighing more than the first predetermined weight threshold,
     detect absence of an occupant directly on a vehicle seating surface when the measured capacitance is less than a predetermined capacitance, and
     in response to the detected absence of the occupant directly on the vehicle seating surface,
       compare the at least one of the measured pressure and the measured weight on the seat to at least one of a second predetermined pressure and a second predetermined weight, respectively, and
       based on the comparison, generate the occupant classification differentiating between (i) the seat having an empty condition or a non-occupant object directly on the vehicle seating surface weighing less than the second predetermined weight threshold, and (ii) the seat having a child restraint seat or a non-occupant object directly on the vehicle seating surface weighing more than the second predetermined weight threshold and less than the first predetermined weight threshold.

2. The occupant classification system of claim 1, wherein the controller is configured to detect presence of an occupant directly on a vehicle seating surface when the measured capacitance is greater than a predetermined capacitance.

3. The occupant classification system of claim 2, wherein the controller is configured to, in response to the detected presence of the occupant directly on the vehicle seating surface:
   compare the at least one of the measured pressure and the measured weight on the seat to one or more predetermined pressure thresholds or one or more predetermined weight thresholds, respectively, the one or more predetermined weight thresholds comprising the first predetermined weight threshold and a second predetermined weight threshold, and the second predetermined weight threshold being larger than the first predetermined weight threshold; and
   based on the comparison, generate the occupant classification by differentiating between the seat having, directly on the vehicle seating surface, i) a capacitive object, ii) an occupant weighing less than the first predetermined weight threshold, and iii) an occupant weighing more than the second predetermined weight threshold.

4. The occupant classification system of claim 3, wherein the controller is configured to, in response to the detected presence of the occupant directly on the vehicle seating surface, select a non-adult classification as the occupant classification if the at least one of the measured pressure and the measured weight is less than a first predetermined pressure threshold or the first predetermined weight threshold, respectively.

5. The occupant classification system of claim 4, wherein the controller is configured to, in response to the detected presence of the occupant directly on the vehicle seating surface, select a non-adult classification as the occupant classification if the at least one of the measured pressure and the measured weight is greater than the first predetermined pressure threshold and less than a second predetermined pressure threshold or greater than the first predetermined weight threshold and less than the second predetermined weight threshold, respectively.

6. The occupant classification system of claim 5, wherein the controller is configured to, in response to the detected presence of the occupant directly on the vehicle seating surface, select an adult classification as the occupant classification if the at least one of the measured pressure and the measured weight is greater than the first predetermined pressure threshold and the second predetermined pressure threshold or greater than the first predetermined weight threshold and the second predetermined weight threshold, respectively.

7. The occupant classification system of claim 1, wherein:
the controller is further configured to alter at least one operating parameter of a vehicle system in response to the occupant classification;
the vehicle system includes an airbag system; and
the at least one operating parameter of the airbag system includes enabling or disabling airbag operation.

8. The occupant classification system of claim 1, wherein:
the controller is further configured to alter at least one operating parameter of a vehicle system in response to the occupant classification;
the vehicle system includes a seat belt sensing system; and
the at least one operating parameter of the seat belt sensing system includes enabling or disabling seat belt sensing.

9. The occupant classification system of claim 1, wherein the controller is further configured to:
generate an occupant classification based on the measured capacitance and the at least one of the measured weight and the measured pressure on the seat, the occupant classification indicating an adult classification or a non-adult classification; and
in response to the occupant classification indicating an adult classification or a non-adult classification, communicate with a seat belt sensing system and assess restraint usage when the measured capacitance is less than the predetermined capacitance and the at least one of the measured weight and the measured pressure is greater than a first predetermined weight or a first predetermined pressure, respectively.

10. The occupant classification system of claim 1, wherein the controller is further configured to communicate with a seat belt sensing system and to not assess restraint usage when the measured capacitance is less than the predetermined capacitance and the at least one of the measured pressure and the measured weight is less than a predetermined pressure threshold or a predetermined weight threshold, respectively.

11. An occupant classification system comprising:
a capacitive sensor configured to measure capacitance, wherein the capacitive sensor is at least partially arranged between a seat frame and at least one of a seat cover and a seat cushion of a seat;
a sensor configured to measure at least one of weight and pressure on the seat,
wherein the sensor is at least partially arranged between a vehicle structure and a component of the seat; and
a controller configured to
detect whether an occupant is directly on a vehicle seating surface of the seat and generate an occupant classification based on the measured capacitance and the at least one of the measured weight and the measured pressure on the seat,
in response to detected presence of an occupant directly on the vehicle seating surface, select an adult classification as the occupant classification if the at least one of the measured pressure and the measured weight is greater than a first predetermined pressure threshold or greater than a first predetermined weight threshold, respectively,
communicate with a seat belt sensing system and assess restraint usage in response to the adult classification,
detect absence of an occupant directly on a vehicle seating surface when the measured capacitance is less than a predetermined capacitance, and
in response to the detected absence of the occupant directly on the vehicle seating surface,
compare the at least one of the measured pressure and the measured weight on the seat to at least one of a second predetermined pressure and a second predetermined weight, respectively, and
based on the comparison, generate the occupant classification differentiating between (i) the seat having an empty condition or a non-occupant object directly on the vehicle seating surface weighing less than the second predetermined weight threshold, and (ii) the seat having a child restraint seat or a non-occupant object directly on the vehicle seating surface weighing more than the second predetermined weight threshold and less than the first predetermined weight threshold.

12. The occupant classification system of claim 1, wherein:
the capacitance sensor includes:
a conductive material; and
a capacitance measuring circuit connected to the conductive material and configured to generate the measured capacitance; and
the sensor includes at least one of:
a bladder enclosing a fluid and a pressure sensor configured to sense a pressure of the fluid in the bladder; and
a load cell.

13. The occupant classification system of claim 1, wherein the controller is configured to initiate occupant classification in response to at least one of:
an ignition changing state from OFF to ON;
a vehicle door changing state;
a drive state of a host vehicle of the seat changing;
a seat belt buckle status changing state;
the occupant classification system detecting a change in the at least one of the measured capacitance, the measured weight and the measured pressure; and
an autonomous ride state changing.

14. The occupant classification of claim 1, wherein the controller is configured to terminate occupant classification in response to at least one of:
an ignition changing state from ON to OFF;
a predetermined amount of time passing after an occupant classification was performed;
a host vehicle of the seat being taken out of a drive state;
a door of the host vehicle opening; and
a stop ride signal being generated.

15. An occupant classification system comprising:
a capacitive sensor configured to measure capacitance, wherein the capacitive sensor is at least partially arranged between a seat frame and at least one of a seat cover and a seat cushion of a seat;
a sensor configured to measure at least one of weight and pressure on the seat,
wherein the sensor is at least partially arranged between a vehicle structure and a component of the seat; and
a controller configured to generate an occupant classification based on the measured capacitance and the at least one of the measured weight and the measured pressure on the seat, wherein the occupant classification differentiates between (i) an empty seat or a non-occupant object weighing less than or equal to a first predetermined weight threshold and (ii) a child restraint seat or a non-occupant object weighing more than the first predetermined weight threshold,
wherein the occupant classification differentiates between a non-occupant object weighing less than or equal to the first predetermined weight threshold and a child restraint seat or a non-occupant object weighing more than the first predetermined weight threshold.

16. The occupant classification system of claim 1, wherein the controller is configured to:
in response to the occupant classification indicating an empty seat or a non-occupant object weighing less than or equal to the first predetermined weight threshold, refrain from communicating with a seat belt sensing system to assess restraint usage for the seat; and
in response to the occupant classification indicating a child restraint seat or a non-occupant object weighing more than the first predetermined weight threshold, communicate with the seat belt sensing system to assess restraint usage for the seat.

17. The occupant classification system of claim 1, wherein the controller is configured to:
in response to the occupant classification indicating an empty seat or a non-occupant object weighing less than or equal to the first predetermined weight threshold, refrain from communicating with a seat belt sensing system to assess restraint usage for the seat; and
in response to the occupant classification indicating a child restraint seat or a non-occupant object weighing more than the first predetermined weight threshold, communicate with a seat belt sensing system to assess restraint usage for the seat.

18. The occupant classification system of claim 11, wherein the controller is configured to:
assess the restraint usage for at least one of a non-adult classification or a non-occupant classification; and
not access restraint usage for a non-occupant classification and the measured pressure and the measured weight being less than a second predetermined pressure threshold or less than the second predetermined weight threshold, respectively,
wherein
the second predetermined pressure threshold is less than the first predetermined pressure threshold, and
the second predetermined weight threshold is less than the first predetermined weight threshold.

19. The occupant classification system of claim 15, wherein the controller is configured to:
in response to the occupant classification indicating a non-occupant object weighing less than or equal to the first predetermined weight threshold, refrain from communicating with a seat belt sensing system to assess restraint usage for the seat; and
in response to the occupant classification indicating a child restraint seat or a non-occupant object weighing more than the first predetermined weight threshold, communicate with the seat belt sensing system to assess restraint usage for the seat.

* * * * *